US008890055B2

(12) United States Patent
Ogino

(10) Patent No.: US 8,890,055 B2
(45) Date of Patent: Nov. 18, 2014

(54) SOLID-STATE IMAGING DEVICE, METHOD OF PRODUCING THE SAME, AND CAMERA

(75) Inventor: Akiko Ogino, Kumamoto (JP)

(73) Assignee: Sony Corporation (JP)

( * ) Notice: Subject to any disclaimer, the term of this patent is extended or adjusted under 35 U.S.C. 154(b) by 904 days.

(21) Appl. No.: 12/629,264

(22) Filed: Dec. 2, 2009

(65) Prior Publication Data
US 2010/0133420 A1 Jun. 3, 2010

(30) Foreign Application Priority Data

Dec. 3, 2008 (JP) ................................ 2008-308295

(51) Int. Cl.
*G01J 3/50* (2006.01)
*H01L 27/146* (2006.01)
*G01J 1/02* (2006.01)
*G01J 1/04* (2006.01)
*G01J 1/44* (2006.01)

(52) U.S. Cl.
CPC ............ *G01J 1/44* (2013.01); *H01L 27/14625* (2013.01); *G01J 1/0209* (2013.01); *G01J 1/04* (2013.01); *G01J 1/0411* (2013.01); *G01J 1/02* (2013.01); *G01J 1/0422* (2013.01); *H01L 27/14621* (2013.01); *G01J 1/0407* (2013.01); *H01L 27/14685* (2013.01)
USPC ........ 250/226; 250/208.1; 257/440; 348/273; 430/46.3; 430/332; 430/333

(58) Field of Classification Search
CPC .................. G01J 1/02; G01J 1/04; G01J 1/44; G01J 1/0209; G01J 1/0407; G01J 1/0411; G01J 1/0422; H01L 27/14621; H01L 27/14625; H01L 27/14685
USPC ............... 250/208.1, 226; 348/273; 430/46.3, 430/270.1, 332, 333
See application file for complete search history.

(56) References Cited

U.S. PATENT DOCUMENTS 4,447,720 A * 5/1984 Ogawa et al. ................. 257/443
4,560,457 A * 12/1985 Ogawa ............................ 522/11

(Continued)

FOREIGN PATENT DOCUMENTS

JP 06276762 A * 9/1994
JP 06-342896 12/1994

(Continued)

OTHER PUBLICATIONS

Japanese Patent Office Action dated Nov. 2, 2010 corresponding to Japanese Serial No. 2008-308295.

*Primary Examiner* — Georgia Y Epps
*Assistant Examiner* — Kevin Wyatt
(74) *Attorney, Agent, or Firm* — Sheridan Ross P.C.

(57) ABSTRACT

A method of producing a solid-state imaging device includes the steps of forming on a substrate a photoelectric conversion portion that receives light on a light-receiving surface and that photoelectrically converts the received light to generate a signal charge, forming above the light-receiving surface an optical waveguide that guides light to the light-receiving surface, and forming above the optical waveguide a color filter which colors light and from which colored light is emitted to the optical waveguide, wherein, in forming the color filter, the color filter is formed from a photosensitive resin film containing a dye by performing an exposure process and then performing a development process on the film, and in forming the optical waveguide, a core portion of the optical waveguide is formed so that the core portion absorbs exposure light radiated onto the photosensitive resin film when the exposure process is performed.

17 Claims, 13 Drawing Sheets

(56) References Cited

U.S. PATENT DOCUMENTS

| | | | |
|---|---|---|---|
| 4,820,619 A * | 4/1989 | Sanada et al. | 430/197 |
| 5,250,378 A * | 10/1993 | Wang | 430/83 |
| 5,943,463 A * | 8/1999 | Unuma et al. | 385/119 |
| 7,298,955 B2 * | 11/2007 | Kooriyama | 385/146 |
| 7,666,704 B2 * | 2/2010 | Suzuki et al. | 438/69 |
| 2003/0031402 A1 * | 2/2003 | DeRosa et al. | 385/16 |
| 2003/0096192 A1 * | 5/2003 | Berneth et al. | 430/270.15 |
| 2006/0077268 A1 * | 4/2006 | Yokozawa | 348/272 |
| 2007/0284687 A1 * | 12/2007 | Rantala | 257/432 |
| 2007/0287086 A1 * | 12/2007 | Shinada et al. | 430/75 |
| 2009/0207287 A1 * | 8/2009 | Miya et al. | 348/273 |

FOREIGN PATENT DOCUMENTS

| | | |
|---|---|---|
| JP | 08139300 A * | 5/1996 |
| JP | 2006-156799 | 6/2006 |
| JP | 2006-222270 | 8/2006 |
| JP | 2008-218650 | 9/2008 |

* cited by examiner

SOLID-STATE IMAGING DEVICE, METHOD OF PRODUCING THE SAME, AND CAMERA

BACKGROUND OF THE INVENTION

1. Field of the Invention

The present invention relates to a solid-state imaging device, a method of producing the same, and a camera. In particular, the present invention relates to a solid-state imaging device including a photoelectric conversion portion that receives light on a light-receiving surface and that photoelectrically converts the light received on the light-receiving surface to generate a signal charge and an optical waveguide that guides light to the light-receiving surface, a method of producing the same, and a camera including the solid-state imaging device.

2. Description of the Related Art

Cameras such as a digital video camera and a digital still camera include a solid-state imaging device. For example, such cameras include a complementary metal oxide semiconductor (CMOS) image sensor or a charge-coupled device (CCD) image sensor as a solid-state imaging device.

In a solid-state imaging device, an imaging region where a plurality of pixels are provided is disposed on a surface of a semiconductor substrate. In this imaging region, a plurality of photoelectric conversion portions that receive light from an object image and that photoelectrically convert the received light to generate signal charges are provided so as to correspond to the plurality of pixels. For example, photodiodes are provided as the photoelectric conversion portions.

In such a solid-state imaging device, with an increase in the number of pixels, the cell size of each pixel has been reduced. As a result, the amount of light received per pixel may decrease, resulting in a decrease in the sensitivity.

Consequently, in order to increase the light-focusing efficiency to improve the sensitivity, an optical waveguide is formed for each pixel.

Specifically, the optical waveguide is composed of an optical material having a high refractive index and includes a core portion that guides light. A cladding portion having a lower refractive index than that of the core portion is provided around the core portion. Consequently, in the optical waveguide, incident light can be totally reflected at the interface between the core portion and the cladding portion. Accordingly, by providing the optical waveguide, the light-focusing efficiency can be increased to improve the sensitivity. For example, the core portion is formed of an organic resin material (refer to, for example, Japanese Unexamined Patent Application Publication Nos. 2006-222270 and 2006-156799).

In addition, in such a solid-state imaging device, a color filter is provided on the core portion of the optical waveguide. In the color filter, light is colored and emitted to the optical waveguide. This color filter is formed by using a photolithography technique.

Specifically, for example, the color filter is formed by applying a photosensitive resin film containing a dye, and then sequentially performing an exposure process and a development process on the photosensitive resin film.

SUMMARY OF THE INVENTION

In the formation of a color filter using a photolithography technique as described above, it may be difficult to pattern the color filter with a high accuracy. As a result, the image quality of an acquired image may be decreased.

Furthermore, the problem described above may become serious due to an effect of a residue of the photosensitive resin film remaining in the formation of the color filter using a photolithography technique. Such a problem is mainly caused by reflection of exposure light at a layer disposed under the photosensitive resin film during the exposure process on the photosensitive resin film.

In another case, the reliability of a device may be decreased because an adhesive force between a color filter and an optical waveguide disposed under the color filter is insufficient.

Consequently, in order to solve the above problem, an underlayer-planarizing film configured to provide an anti-reflection function and an adhesion function may be provided under the photosensitive resin film.

However, the formation of the underlayer-planarizing film increases the number of production steps, and thus the production efficiency may be decreased. Furthermore, the amount of light received by a photoelectric conversion element is decreased by the presence of the underlayer-planarizing film, and thus the sensitivity may be decreased.

Therefore, it may be difficult to sufficiently solve the above-described problems.

Accordingly, it is desirable to provide a solid-state imaging device in which the image quality of an acquired image can be improved and the production efficiency can be improved, a method of producing the same, and a camera including the solid-state imaging device.

According to an embodiment of the present invention, there is provided a method of producing a solid-state imaging device including the steps of forming on a substrate a photoelectric conversion portion that receives light on a light-receiving surface and that photoelectrically converts the light received on the light-receiving surface to generate a signal charge, forming above the light-receiving surface an optical waveguide that guides light to the light-receiving surface, and forming above the optical waveguide a color filter which colors light and from which colored light is emitted to the optical waveguide, in which, in the step of forming the color filter, the color filter is formed from a photosensitive resin film containing a dye by performing an exposure process on the photosensitive resin film and then performing a development process on the photosensitive resin film, and in the step of forming the optical waveguide, a core portion of the optical waveguide is formed so that the core portion absorbs exposure light radiated onto the photosensitive resin film when the exposure process is performed in the step of forming the color filter.

In the step of forming the optical waveguide, the core portion is preferably formed so that the core portion contains a dye that absorbs the exposure light.

In the step of forming the optical waveguide, the core portion is preferably formed so that the core portion contains a resin that absorbs the exposure light.

In the step of forming the optical waveguide, the resin preferably includes a conjugated double bond.

The step of forming the optical waveguide preferably includes a step of performing a surface treatment in which the conjugated double bond of the resin is cleaved so that the resin constituting the core portion absorbs the exposure light on a surface facing the color filter at the core portion.

Preferably, the method of producing a solid-state imaging device according to an embodiment of the present invention further includes a step of forming an adhesive layer that closely contacts the color filter and the core portion of the optical waveguide, and the step of forming the adhesive layer is performed between the step of forming the optical waveguide and the step of forming the color filter. In the step of forming the adhesive layer, the adhesive layer is preferably formed so that the adhesive layer contains a resin used in the step of forming the color filter.

According to an embodiment of the present invention, there is provided a method of producing a solid-state imaging device including the steps of forming on a substrate a photoelectric conversion portion that receives light on a light-receiving surface and that photoelectrically converts the light received on the light-receiving surface to generate a signal charge, forming above the light-receiving surface an optical waveguide that guides light to the light-receiving surface, and forming above the optical waveguide a color filter which colors light and from which colored light is emitted to the optical waveguide, in which, in the step of forming the color filter, the color filter is formed from a photosensitive resin film containing a dye by performing an exposure process on the photosensitive resin film and then performing a development process on the photosensitive resin film, and in the step of forming the optical waveguide, a surface treatment for forming irregularities on a surface of a core portion of the optical waveguide is performed so that exposure light radiated onto the photosensitive resin film when the exposure process is performed in the step of forming the color filter is scattered at a surface facing the color filter at the core portion.

According to an embodiment of the present invention, there is provided a solid-state imaging device including a photoelectric conversion portion that receives light on a light-receiving surface and that photoelectrically converts the light received on the light-receiving surface to generate a signal charge, an optical waveguide that guides light to the light-receiving surface, and a color filter which colors light and from which colored light is emitted to the optical waveguide, in which the color filter is formed by performing an exposure process on a photosensitive resin film containing a dye and then performing a development process on the photosensitive resin film, and the optical waveguide includes a core portion composed of a material that absorbs exposure light radiated onto the photosensitive resin film when the exposure process is performed in the formation of the color filter.

According to an embodiment of the present invention, there is provided a solid-state imaging device including a photoelectric conversion portion that receives light on a light-receiving surface and that photoelectrically converts the light received on the light-receiving surface to generate a signal charge, an optical waveguide that guides light to the light-receiving surface, and a color filter which colors light and from which colored light is emitted to the optical waveguide, in which the color filter is formed by performing an exposure process on a photosensitive resin film containing a dye and then performing a development process on the photosensitive resin film, and irregularities are provided on a surface of a core portion of the optical waveguide so that exposure light radiated onto the photosensitive resin film when the exposure process is performed in the formation of the color filter is scattered at a surface facing the color filter at the core portion.

According to an embodiment of the present invention, there is provided a camera including a photoelectric conversion portion that receives light on a light-receiving surface and that photoelectrically converts the light received on the light-receiving surface to generate a signal charge, an optical waveguide that guides light to the light-receiving surface, and a color filter which colors light and from which colored light is emitted to the optical waveguide, in which the color filter is formed by performing an exposure process on a photosensitive resin film containing a dye and then performing a development process on the photosensitive resin film, and the optical waveguide includes a core portion composed of a material that absorbs exposure light radiated onto the photosensitive resin film when the exposure process is performed in the formation of the color filter.

According to an embodiment of the present invention, there is provided a camera including a photoelectric conversion portion that receives light on a light-receiving surface and that photoelectrically converts the light received on the light-receiving surface to generate a signal charge, an optical waveguide that guides light to the light-receiving surface, and a color filter which colors light and from which colored light is emitted to the optical waveguide, in which the color filter is formed by performing an exposure process on a photosensitive resin film containing a dye and then performing a development process on the photosensitive resin film, and irregularities are provided on a surface of a core portion of the optical waveguide so that exposure light radiated onto the photosensitive resin film when the exposure process is performed in the formation of the color filter is scattered at a surface facing the color filter at the core portion.

According to an embodiment of the present invention, when an exposure process is performed in a step of forming a color filter, a core portion of an optical waveguide is formed so that exposure light radiated onto a photosensitive resin film is absorbed or scattered at the core portion of the optical waveguide.

According to an embodiment of the present invention, it is possible to provide a solid-state imaging device in which the image quality of an acquired image can be improved and the production efficiency can be improved, a method of producing the same, and a camera including the solid-state imaging device.

DESCRIPTION OF THE PREFERRED EMBODIMENTS

Embodiments of the present invention will now be described with reference to the accompanying drawings.

First Embodiment

[Configuration of Device]

Figure 1:
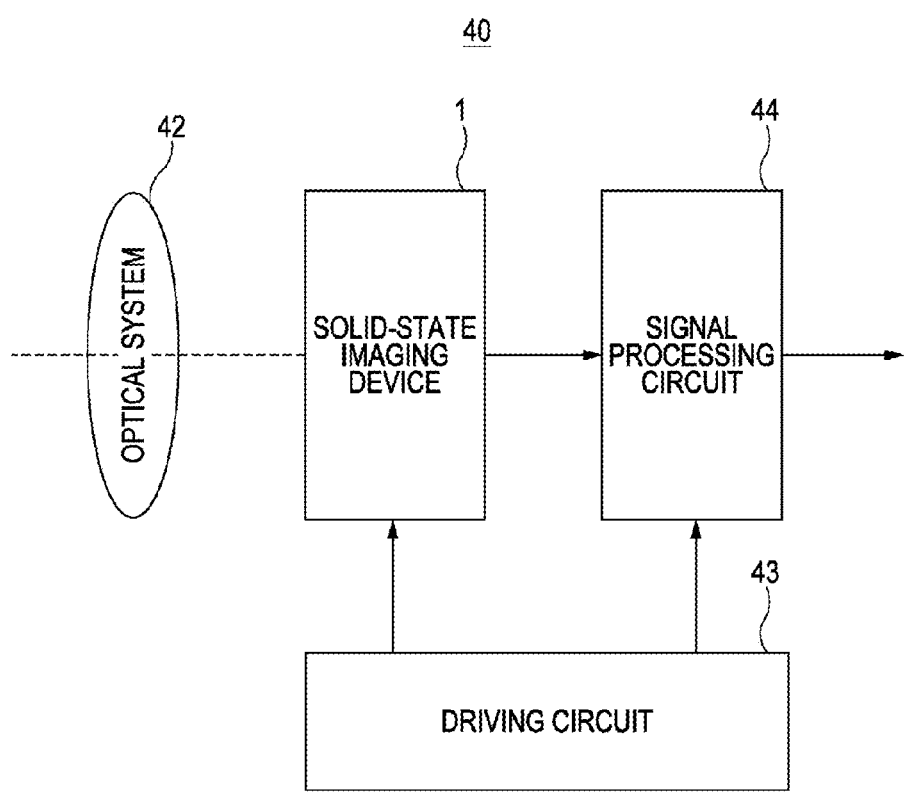
FIG. 1 is a structural diagram showing the configuration of a camera in a first embodiment of the present invention.

FIG. 1 is a structural diagram showing the configuration of a camera 40 in a first embodiment of the present invention.

As shown in FIG. 1, the camera 40 includes a solid-state imaging device 1, an optical system 42, a driving circuit 43, and a signal processing circuit 44. Each of the components will now be sequentially described.

The solid-state imaging device 1 receives light from an object image through the optical system 42, and photoelectrically converts the light from the object image to generate a signal charge. In this embodiment, the solid-state imaging device 1 is driven on the basis of a driving signal output from the driving circuit 43. Specifically, the signal charge is read in the solid-state imaging device 1 and is output as raw data. The detail of this solid-state imaging device 1 will be described below.

The optical system 42 includes, for example, an optical lens and focuses the object image on an imaging surface of the solid-state imaging device 1.

The driving circuit 43 outputs various driving signals to the solid-state imaging device 1 and the signal processing circuit 44 to drive each of the solid-state imaging device 1 and the signal processing circuit 44.

The signal processing circuit 44 performs a signal processing of the raw data output from the solid-state imaging device 1 to form a digital image of the object image.

The overall configuration of the solid-state imaging device 1 will be described.

Figure 2:
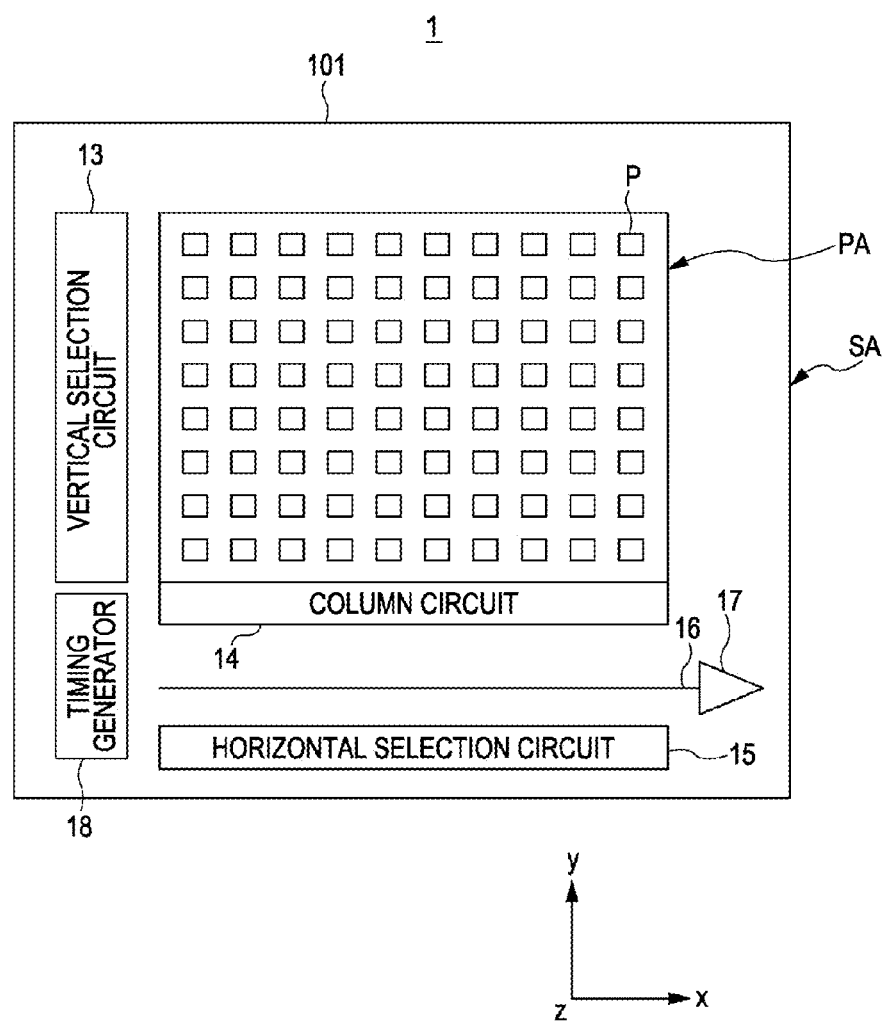
FIG. 2 is a plan view showing the outline of the overall configuration of a solid-state imaging device in the first embodiment of the present invention.

FIG. 2 is a plan view showing the outline of the overall configuration of the solid-state imaging device 1 in the first embodiment of the present invention.

The solid-state imaging device 1 of this embodiment is a CMOS image sensor and includes a substrate 101 as shown in FIG. 2. The substrate 101 is, for example, a semiconductor substrate composed of silicon. As shown in FIG. 2, an imaging region PA and a peripheral region SA are provided on a surface of the substrate 101.

On the surface of the substrate 101, the imaging region PA has a rectangular shape as shown in FIG. 2, and a plurality of pixels P are arranged in an x-direction and in a y-direction in the imaging region PA. That is, the pixels P are arranged in a matrix. In addition, in the imaging region PA, the center thereof is arranged so as to correspond to an optical axis of the optical system 42 shown in FIG. 1.

On the surface of the substrate 101, as shown in FIG. 2, the peripheral region SA is disposed around the imaging region PA. Peripheral circuits configured to process signal charges generated in the pixels P are provided in the peripheral region SA.

Specifically, as shown in FIG. 2, a vertical selection circuit 13, a column circuit 14, a horizontal selection circuit 15, a horizontal signal line 16, an output circuit 17, and a timing generator (TG) 18 are provided as the peripheral circuits.

The vertical selection circuit 13 includes, for example, a shift register, and selectively drives the pixels P in units of rows.

The column circuit 14 includes, for example, a sample-and-hold (S/H) circuit and a correlated double sampling (CDS) circuit. The column circuit 14 performs signal processing of signals read from the pixels P in units of columns.

The horizontal selection circuit 15 includes, for example, a shift register and sequentially selects and outputs the signals read from the individual pixels P by the column circuit 14. The signals sequentially read from the pixels P by the selective driving of the horizontal selection circuit 15 are output to the output circuit 17 through the horizontal signal line 16.

The output circuit 17 includes, for example, a digital amplifier. The output circuit 17 performs a signal processing such as amplification processing of the signals output from the horizontal selection circuit 15 and then outputs the signals.

The timing generator 18 generates various timing signals and outputs the signals to the vertical selection circuit 13, the column circuit 14, and the horizontal selection circuit 15, thereby controlling the drive of the circuits.

Figure 3:
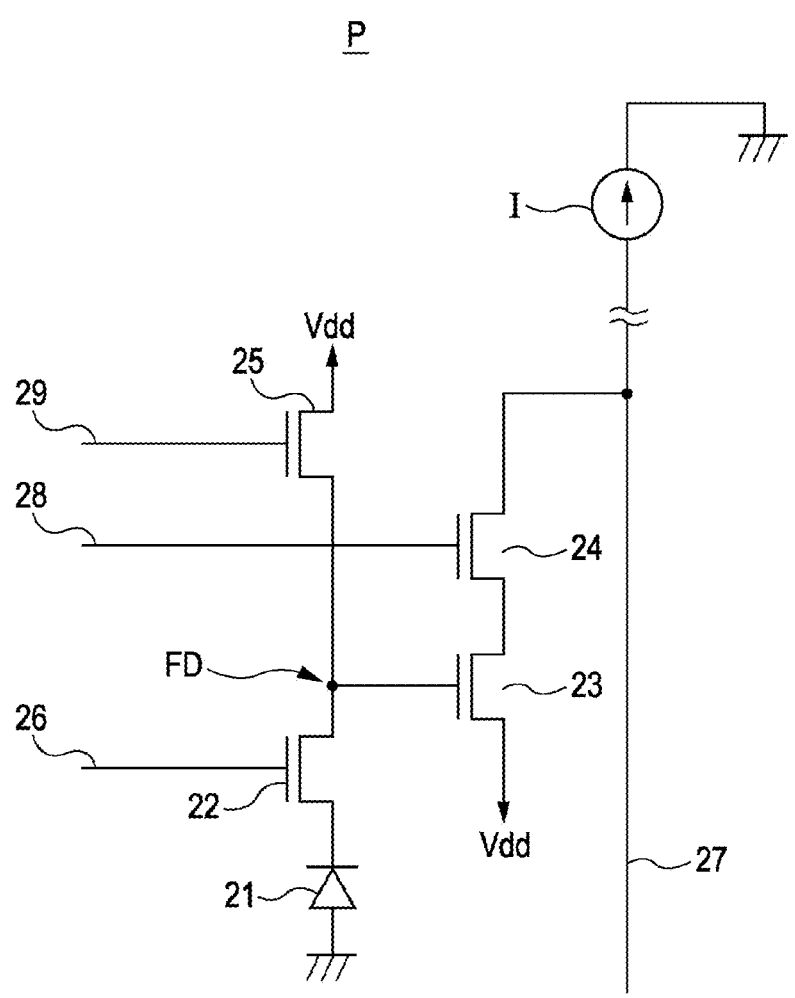
FIG. 3 is a circuit diagram showing the relevant part of a pixel P provided in an imaging region in the first embodiment of the present invention.

FIG. 3 is a circuit diagram showing the relevant part of a pixel P provided in the imaging region PA in the first embodiment of the present invention.

As shown in FIG. 3, the pixel P provided in the imaging region PA includes a photodiode 21, a transfer transistor 22, an amplifying transistor 23, an address transistor 24, and a reset transistor 25. That is, the photodiode 21 and pixel transistors configured to perform an operation of reading signal charges from the photodiode 21 are provided.

In the pixel P, the photodiode 21 receives light from an object image and photoelectrically converts the received light to generate and accumulate signal charges. As shown in FIG. 3, the photodiode 21 is connected to a gate of the amplifying transistor 23 via the transfer transistor 22. In the photodiode 21, the accumulated signal charges are transferred as output signals to a floating diffusion FD connected to the gate of the amplifying transistor 23 by the transfer transistor 22.

In the pixel P, as shown in FIG. 3, the transfer transistor 22 is interposed between the photodiode 21 and the floating diffusion FD. When a transfer pulse is provided from a transfer line 26 to a gate of the transfer transistor 22, the transfer transistor 22 transfers the signal charges accumulated in the photodiode 21 as output signals to the floating diffusion FD.

In the pixel P, as shown in FIG. 3, the gate of the amplifying transistor 23 is connected to the floating diffusion FD, and the amplifying transistor 23 amplifies output signals output through the floating diffusion FD. In this embodiment, the amplifying transistor 23 is connected to a vertical signal line 27 via the address transistor 24 and constitutes a source follower with a constant-current source I provided in a region other than the imaging region PA. Therefore, when an address signal is supplied to the address transistor 24, an output signal output from the floating diffusion FD is amplified in the amplifying transistor 23.

In the pixel P, as shown in FIG. 3, a gate of the address transistor 24 is connected to an address line 28 to which an address signal is supplied. When the address signal is supplied to the address transistor 24, the address transistor 24 turns to the on-state and outputs an output signal amplified by the amplifying transistor 23 as described above to the vertical signal line 27. The output signal is output to the above-mentioned S/H and CDS circuits of the column circuit 14 through the vertical signal line 27.

In the pixel P, as shown in FIG. 3, a gate of the reset transistor 25 is connected to a reset line 29 to which a reset signal is supplied. The reset transistor 25 is connected so as to be interposed between a power supply Vdd and the floating diffusion FD. When the reset signal is supplied from the reset line 29 to the gate, the reset transistor 25 resets the electric potential of the floating diffusion FD to the electric potential of the power supply Vdd.

The gate of the transfer transistor 22, the gate of the address transistor 24, and the gate of the reset transistor 25 are connected in units of rows composed of a plurality of pixels arranged in the horizontal direction. Accordingly, the above-described driving operation of the pixels is simultaneously performed for the plurality of pixels arranged in units of rows. Specifically, the pixels are sequentially selected in the vertical direction in units of horizontal lines (pixel rows) by the address signal supplied from the vertical selection circuit 13. Furthermore, the transistors of each pixel are controlled by various timing signals output from the timing generator 18. Consequently, an output signal in each pixel is read into the S/H and CDS circuits of the column circuit 14 through the vertical signal line 27 for each pixel column.

The solid-state imaging device 1 according to this embodiment will be described in detail.

Figure 4:
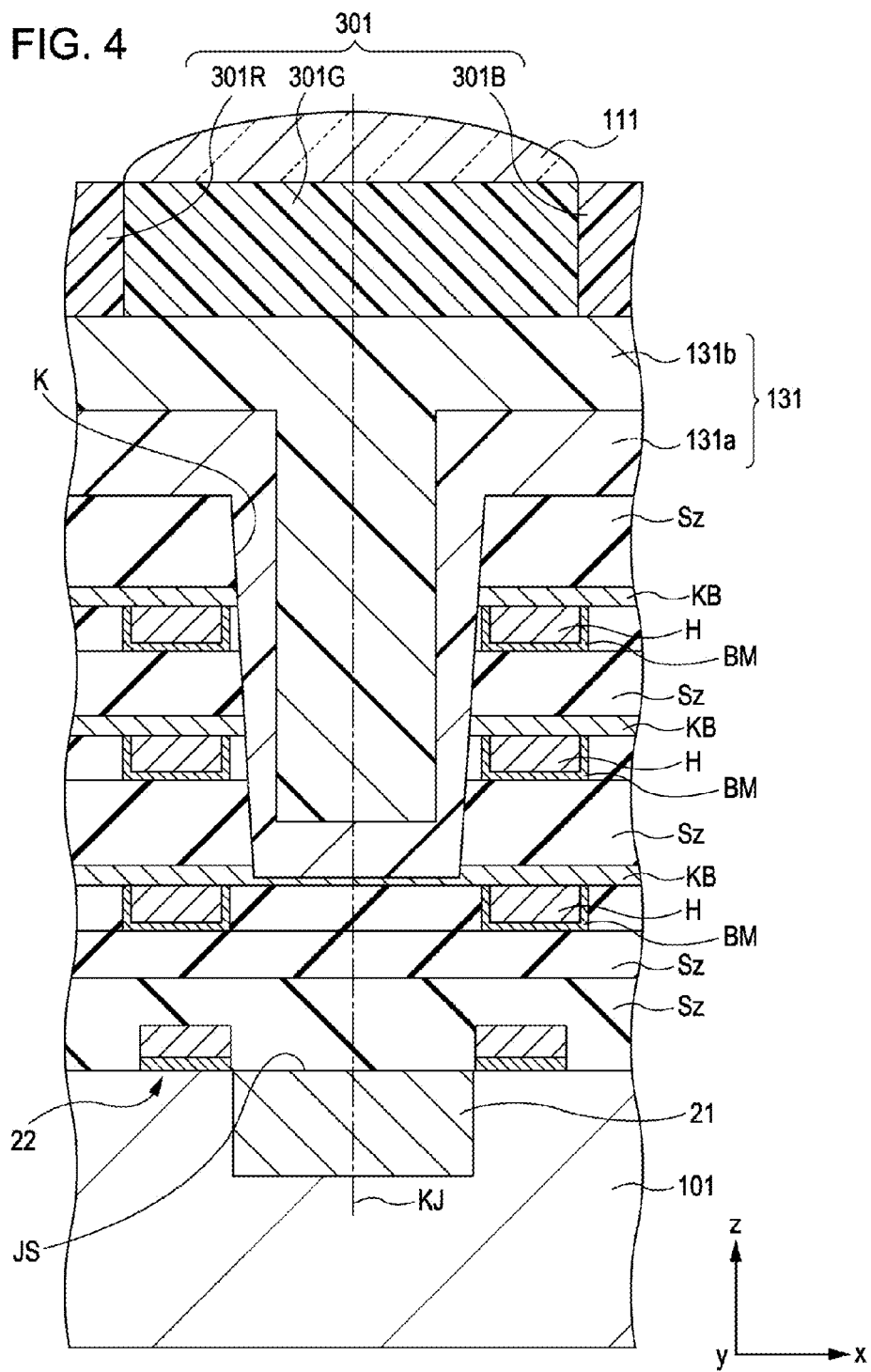
FIG. 4 is a cross-sectional view showing the relevant part of the solid-state imaging device in the first embodiment of the present invention.

FIG. 4 is a cross-sectional view showing the relevant part of the solid-state imaging device 1 in the first embodiment of the present invention. FIG. 4 shows a cross section of a main portion corresponding to a pixel P. In the imaging region PA, pixels P are arranged on the substrate 101 as described above, but illustration of the pixels P is omitted except for the main portion.

As shown in FIG. 4, in the solid-state imaging device 1, a photodiode 21, an on-chip lens 111, an optical waveguide core portion 131, and a color filter 301 are provided so as to correspond to the pixel P.

Each of the components will now be sequentially described.

As shown in FIG. 4, the photodiode 21 is provided on a surface of a substrate 101. The photodiode 21 receives light on a light-receiving surface JS and photoelectrically converts the received light to generate a signal charge. In the photodiode 21, as shown in FIG. 4, the on-chip lens 111, the optical waveguide core portion 131, and the color filter 301 are arranged on the surface of the substrate 101 in a z-direction perpendicular to the light-receiving surface JS. In this embodiment, from the light-receiving surface JS side, the optical waveguide core portion 131, the color filter 301, and the on-chip lens 111 are sequentially arranged. Accordingly, in this embodiment, the photodiode 21 receives light that is incident through these components on the light-receiving surface JS and photoelectrically converts the light to generate a signal charge. A transfer transistor 22 is provided on the substrate 101 so as to be adjacent to the photodiode 21.

The on-chip lens 111 is a so-called microlens. The on-chip lens 111 is provided above the surface of the substrate 101 as shown in FIG. 4, and focuses incident light. As shown in FIG. 4, the photodiode 21 is provided on the surface of the substrate 101, and the on-chip lens 111 is disposed so that an optical axis KJ thereof is perpendicular to the center of the light-receiving surface JS of the photodiode 21. The on-chip lens 111 faces the light-receiving surface JS of the photodiode 21, with the color filter 301 and the optical waveguide core portion 131 therebetween, in a direction of the optical axis KJ. The center of the on-chip lens 111 has a larger thickness than the thickness of the edge thereof in a direction from the light-receiving surface JS of the photodiode 21 to the optical waveguide core portion 131. Accordingly, light focused by the on-chip lens 111 is received on the light-receiving surface JS of the photodiode 21 through the color filter 301 and the optical waveguide core portion 131.

The optical waveguide core portion 131 is provided above the surface of the substrate 101 as shown in FIG. 4, and configured to guide the incident light to the light-receiving surface JS of the photodiode 21. As shown in FIG. 4, the optical waveguide core portion 131 is interposed between the color filter 301 and the light-receiving surface JS of the photodiode 21 and guides light that sequentially passes through the on-chip lens 111 and the color filter 301 to the light-receiving surface JS of the photodiode 21.

In this embodiment, as shown in FIG. 4, the optical waveguide core portion 131 is formed so that the area of a surface of the optical waveguide core portion 131, the surface being parallel to the light-receiving surface JS of the photodiode 21, decreases in a direction from the on-chip lens 111 to the photodiode 21. That is, the optical waveguide core portion 131 is formed so as to have a tapered shape.

As shown in FIG. 4, the side faces and the bottom face of the optical waveguide core portion 131 are surrounded by interlayer insulating films Sz functioning as a cladding. As shown in FIG. 4, a plurality of wirings H are provided inside each of the interlayer insulating films Sz located in side face portions of the optical waveguide core portion 131. For example, each of the wirings H is formed by forming a trench for wiring in an interlayer insulating film Sz, forming a barrier metal layer BM on the surface of the trench, and then filling the trench with an electrically conductive material such as copper. Furthermore, in order to prevent the copper constituting the wirings H from diffusing, diffusion-preventing layers KB are provided between a plurality of the interlayer insulating films Sz.

In this embodiment, as shown in FIG. 4, the optical waveguide core portion 131 includes a first core portion 131a and a second core portion 131b.

In the optical waveguide core portion 131, as shown in FIG. 4, the first core portion 131a is disposed on the surfaces of a hole K formed by removing part of the interlayer insulating films Sz and on the top faces of a plurality of interlayer insulating films Sz. This first core portion 131a functions as a passivation film. The first core portion 131a is composed of an optical material having a higher refractive index than that of each of the interlayer insulating films Sz functioning as a cladding. The first core portion 131a is composed of an optical material having a higher refractive index than that of the second core portion 131b provided inside the first core portion 131a. For example, each of the interlayer insulating films Sz is composed of a silicon oxide film. The first core portion 131a is formed by depositing a silicon nitride (SiN) film by a plasma chemical vapor deposition (CVD), whereby the refractive index of the first core portion 131a is higher than that of the interlayer insulating films Sz. Alternatively, the first core portion 131a is preferably composed of a plasma SiON film formed by a plasma CVD method, a photoresist film, or a titanium oxide film.

In the optical waveguide core portion 131, as shown in FIG. 4, the second core portion 131b is an embedded layer and is embedded inside the first core portion 131a. This second core portion 131b is formed by filling an optical material with the hole K formed by removing part of the interlayer insulating films Sz, with the first core portion 131a therebetween. In this embodiment, as shown in FIG. 4, the second core portion 131b corresponds to the optical axis KJ of the on-chip lens 111, and the optical axis KJ of the on-chip lens 111 penetrates through the center of the second core portion 131b. The second core portion 131b is provided on the top faces of the interlayer insulating films Sz, with the first core portion 131a therebetween, and planarizes the surface. The second core portion 131b is composed of an optical material having a lower refractive index than that of the first core portion 131a. For example, the second core portion 131b is formed by applying an acrylic resin by a spin-coating method. Alternatively, the second core portion 131b is preferably composed of a polyimide resin film, a $Si_3N_4$ film, a diamond-like carbon (DLC) film, or a polysiloxane resin film.

The second core portion 131b is configured to contain a dye that absorbs exposure light radiated onto a photosensitive resin film when an exposure process is performed in the formation of the color filter 301. This feature will be described in detail later.

As shown in FIG. 4, the color filter 301 is disposed above the substrate 101 so as to face the light-receiving surface JS. As shown in FIG. 4, the color filter 301 is provided on the second core portion 131b included in the optical waveguide core portion 131. The color filter 301 receives light from an object image, and the light is then colored, and colored light is emitted to the second core portion 131b. This color filter 301 is formed by performing an exposure process on a photosensitive resin film containing a dye, and then performing a development process on the photosensitive resin film. The process of forming the color filter 301 will be described in detail later. For example, as in the second core portion 131b, the color filter 301 is formed by using an acrylic resin as a photosensitive resin. Since the color filter 301 and the second core portion 131b are similarly formed of an acrylic resin, the color filter 301 and the second core portion 131b are suitably formed to be in close contact with each other.

In this embodiment, as shown in FIG. 4, the color filter 301 includes a green filter layer 301G, a red filter layer 301R, and a blue filter layer 301B.

In the color filter 301, the green filter layer 301G is formed so as to have a high light transmittance in a wavelength range corresponding to green, and light from an object image is transmitted as green light. That is, the green filter layer 301G spectrally separates the light from the object image, thereby coloring the light green. In this embodiment, as shown in FIG. 4, the green filter layer 301G is disposed so as to face the light-receiving surface JS of the photodiode 21, with the optical waveguide core portion 131 therebetween, in the direction of the optical axis KJ of the on-chip lens 111. This green filter layer 301G is formed by, for example, applying a coating solution containing a green color pigment and a photosensitive resin by a coating method such as a spin-coating method to form a coating film, and then patterning the coating film by a lithography technique.

In the color filter 301, the red filter layer 301R is formed so as to have a high light transmittance in a wavelength range corresponding to red, and light from the object image is transmitted as red light. That is, the red filter layer 301R spectrally separates the light from the object image, thereby coloring the light red. Although illustration is omitted in FIG. 4, as in the portion of the green filter layer 301G, a photodiode 21, an on-chip lens 111, and an optical waveguide core portion 131 are provided also in a portion of the red filter layer 301R. That is, as in the green filter layer 301G, the red filter layer 301R is disposed so as to face the light-receiving surface JS of the photodiode 21, with the optical waveguide core portion 131 therebetween, in the direction of the optical axis KJ of the on-chip lens 111. This red filter layer 301R is formed by, for example, applying a coating solution containing a red color pigment and a photosensitive resin by a coating method such as a spin-coating method to form a coating film, and then patterning the coating film by a lithography technique.

In the color filter 301, the blue filter layer 301B is formed so as to have a high light transmittance in a wavelength range corresponding to blue, and light from the object image is transmitted as blue light. That is, the blue filter layer 301B spectrally separates the light from the object image, thereby coloring the light blue. Although illustration is omitted in FIG. 4, as in the portion of the green filter layer 301G, a photodiode 21, an on-chip lens 111, and an optical waveguide core portion 131 are provided also in a portion of the blue filter layer 301B. That is, as in the green filter layer 301G, the blue filter layer 301B is disposed so as to face the light-receiving surface JS of the photodiode 21, with the optical waveguide core portion 131 therebetween, in the direction of the optical axis KJ of the on-chip lens 111. This blue filter layer 301B is formed by, for example, applying a coating solution containing a blue color pigment and a photosensitive resin by a coating method such as a spin-coating method to form a coating film, and then patterning the coating film by a lithography technique.

Although not shown in the figure, the red filter layer 301R, the green filter layer 301G, and the blue filter layer 301B are arranged on a surface corresponding to the surface of the substrate 101 in, for example, the Bayer arrangement.

[Method of Producing Solid-State Imaging Device]

A method of producing the above-described solid-state imaging device 1 will now be described.

FIGS. 5 to 9 are cross-sectional views each showing the relevant part formed in a step of the method of producing the solid-state imaging device 1 in the first embodiment of the present invention.

Figure 5:
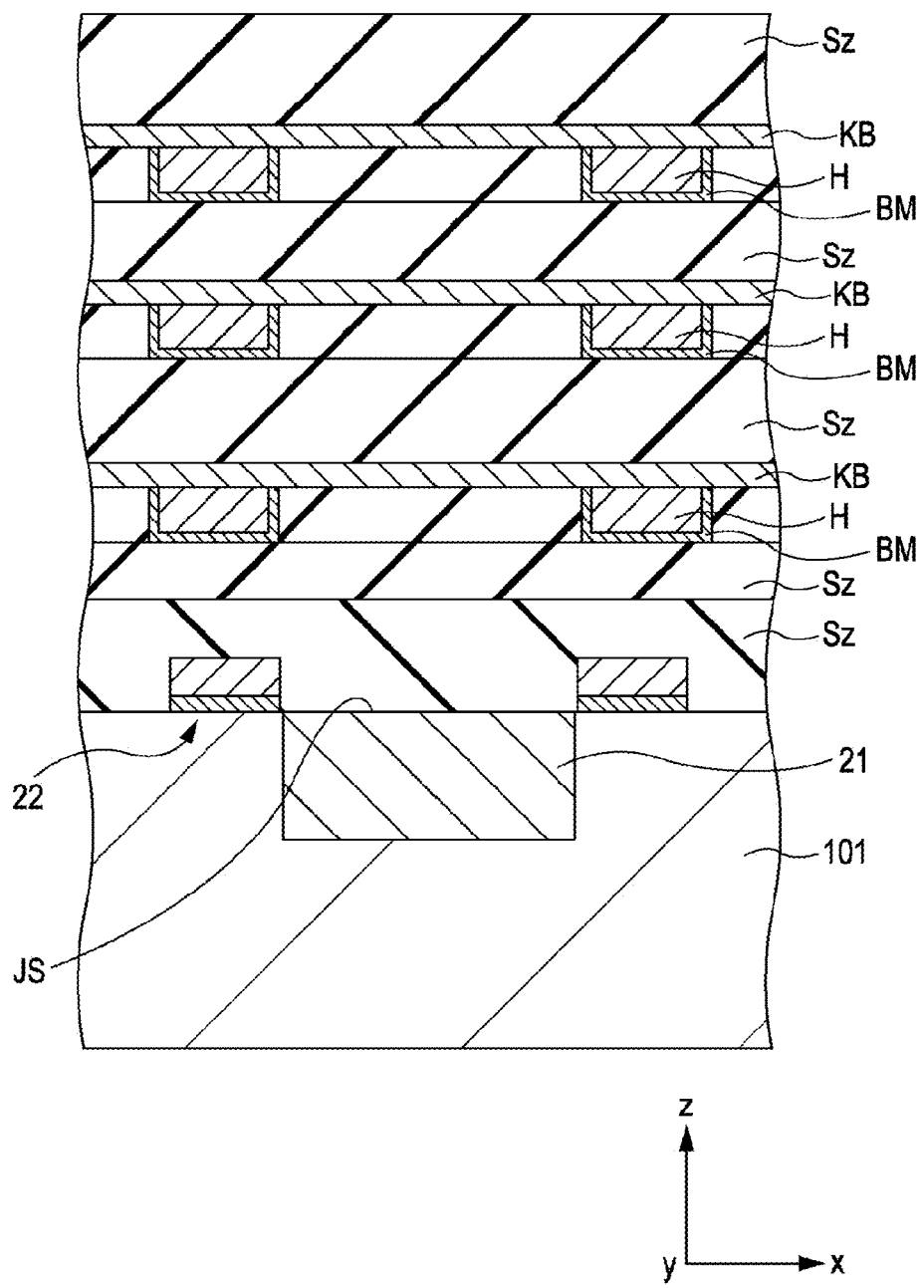
FIG. 5 is a cross-sectional view showing the relevant part formed in a step of a method of producing the solid-state imaging device in the first embodiment of the present invention.

First, as shown in FIG. 5, a photodiode 21 and interlayer insulating films Sz are formed.

The photodiode 21 is formed by, for example, ion-implanting an n-type impurity into a substrate 101 composed of a p-type silicon substrate.

Individual components, such as a transfer transistor 22, constituting a pixel P are then formed.

Subsequently, a plurality of interlayer insulating films Sz are formed on a surface of the substrate 101 so as to cover the photodiode 21. For example, each of the interlayer insulating films Sz is formed by depositing a silicon oxide film by a CVD method.

In the formation of the plurality of interlayer insulating films Sz, wirings H are formed between the interlayer insulating films Sz by, for example, a damascene process.

In this embodiment, each of the wirings H is formed by forming a trench for wiring in an interlayer insulating film Sz, forming a barrier metal layer BM on the surface of the trench, and then filling the trench having the barrier metal layer BM thereon with an electrically conductive material. Specifically, for example, the barrier metal layer BM is formed by sequentially stacking a tantalum film and a tantalum nitride film by a sputtering method. Subsequently, for example, a copper seed layer (not shown) is formed, and a copper film is then formed by electrolytic plating. The resulting surface is then planarized by a chemical mechanical polishing (CMP) process to form the wiring H.

Furthermore, in order to prevent the copper constituting the wirings H from diffusing, diffusion-preventing layers KB are formed between a plurality of the interlayer insulating films Sz. For example, each of the diffusion-preventing layers KB is formed by depositing a silicon carbide film by a CVD method so that the film is disposed as an upper layer of the wirings H.

Figure 6:
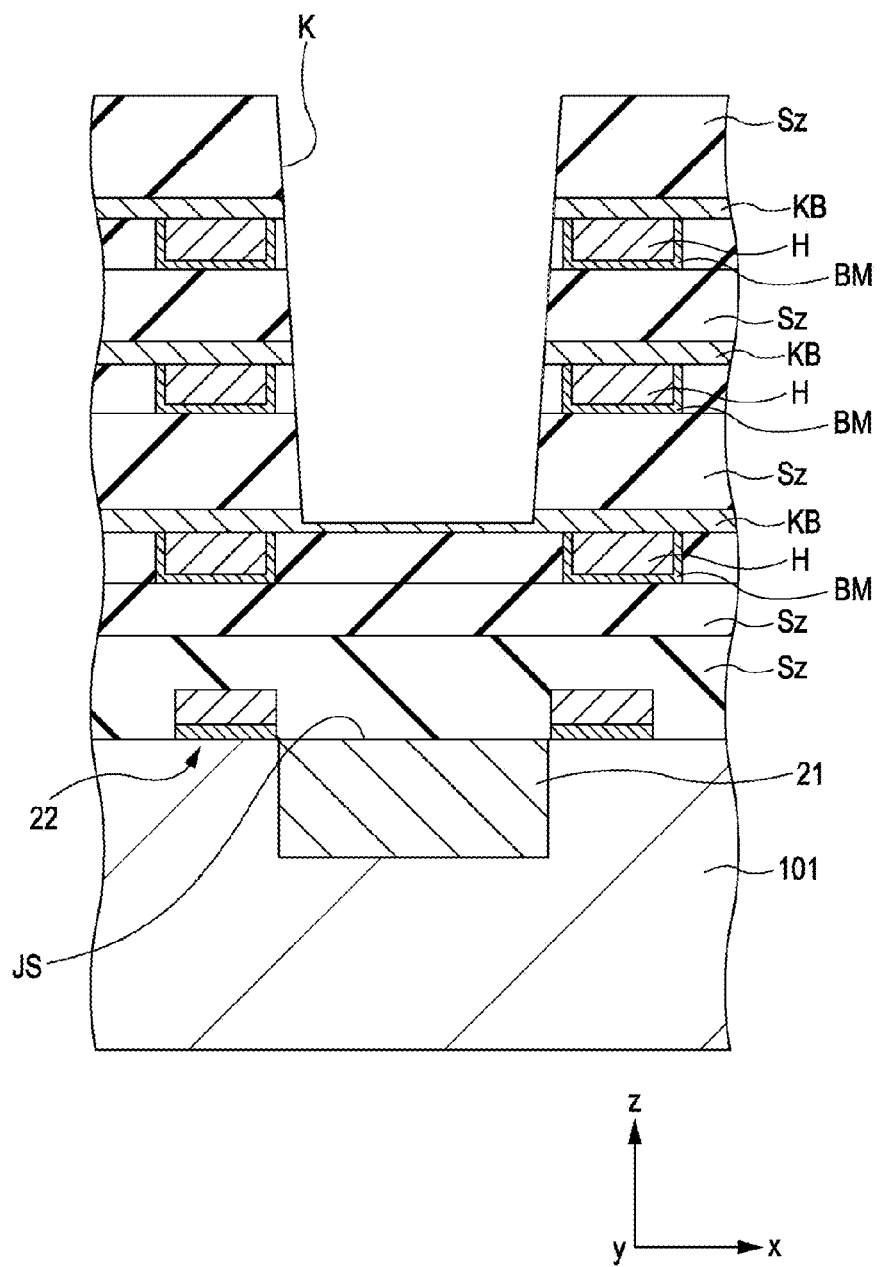
FIG. 6 is a cross-sectional view showing the relevant part formed in a step of the method of producing the solid-state imaging device in the first embodiment of the present invention.

Next, as shown in FIG. 6, a hole K is formed.

In this embodiment, the hole K is formed by removing part of the interlayer insulating films Sz by etching.

Specifically, as shown in FIG. 6, a part of the plurality of interlayer insulating films Sz etc., the part corresponding to a central part of the light-receiving surface JS of the photodiode 21, is removed by etching. In this embodiment, the hole K is formed so that the area of a surface of the hole K, the surface being parallel to the light-receiving surface JS, successively increases from the light-receiving surface JS in the upward direction. That is, the hole K is formed so as to have a tapered shape so that side faces of the hole K are inclined with respect to the z-direction perpendicular to the light-receiving surface JS. This hole K is formed by, for example, performing an anisotropic etching process such as a dry-etching process.

Figure 7:
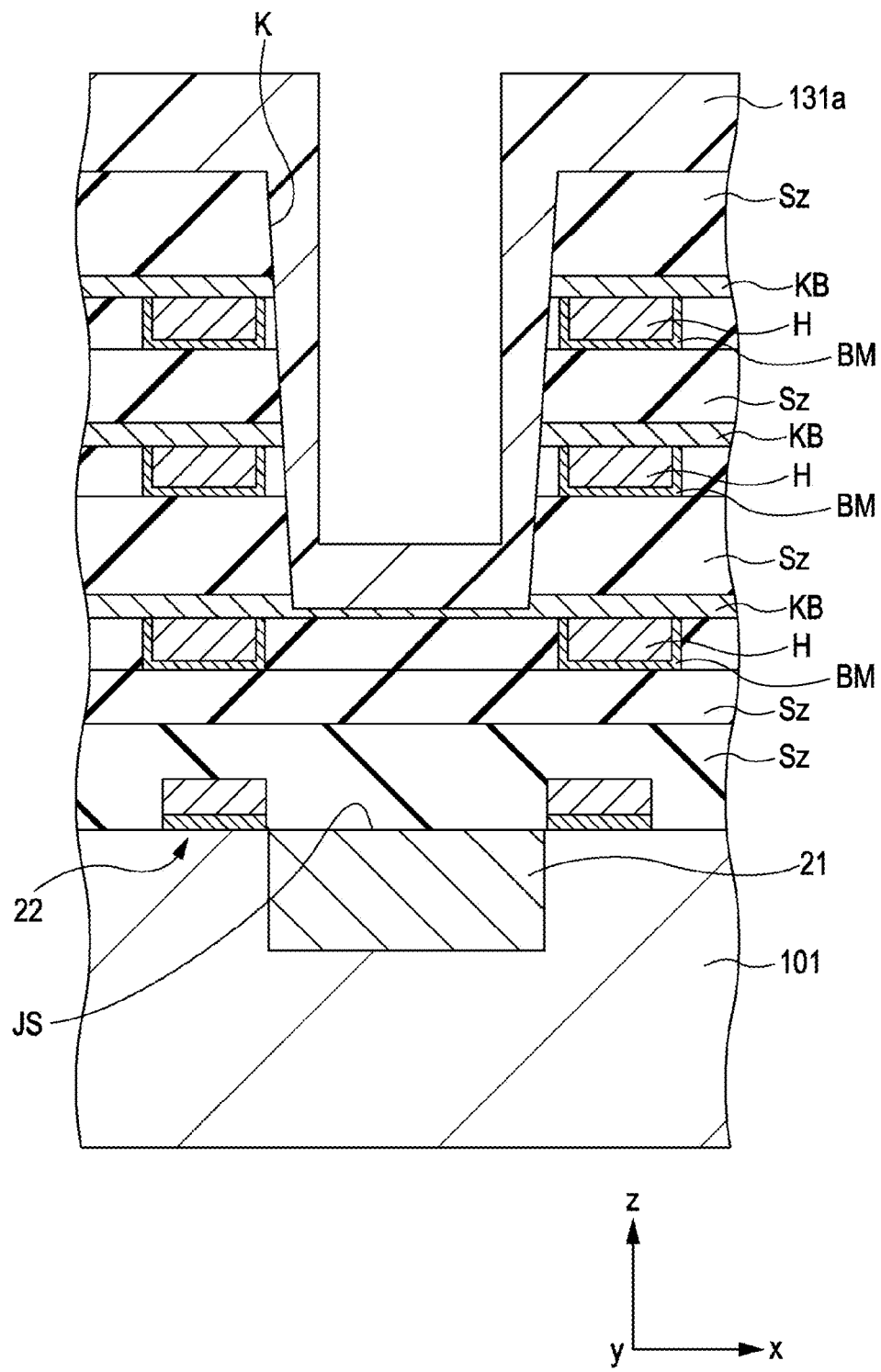
FIG. 7 is a cross-sectional view showing the relevant part formed in a step of the method of producing the solid-state imaging device in the first embodiment of the present invention.

Next, as shown in FIG. 7, a first core portion 131a is formed.

In this embodiment, the first core portion 131a is formed on the surfaces of the hole K formed as described above. The first core portion 131a is formed by, for example, depositing a silicon nitride (SiN) film by a plasma CVD method so as to cover the surface of the hole K.

Specifically, for example, the first core portion 131a is formed so that the silicon nitride (SiN) film having a thickness of 0.5 μm covers the surface of the hole K.

Figure 8:
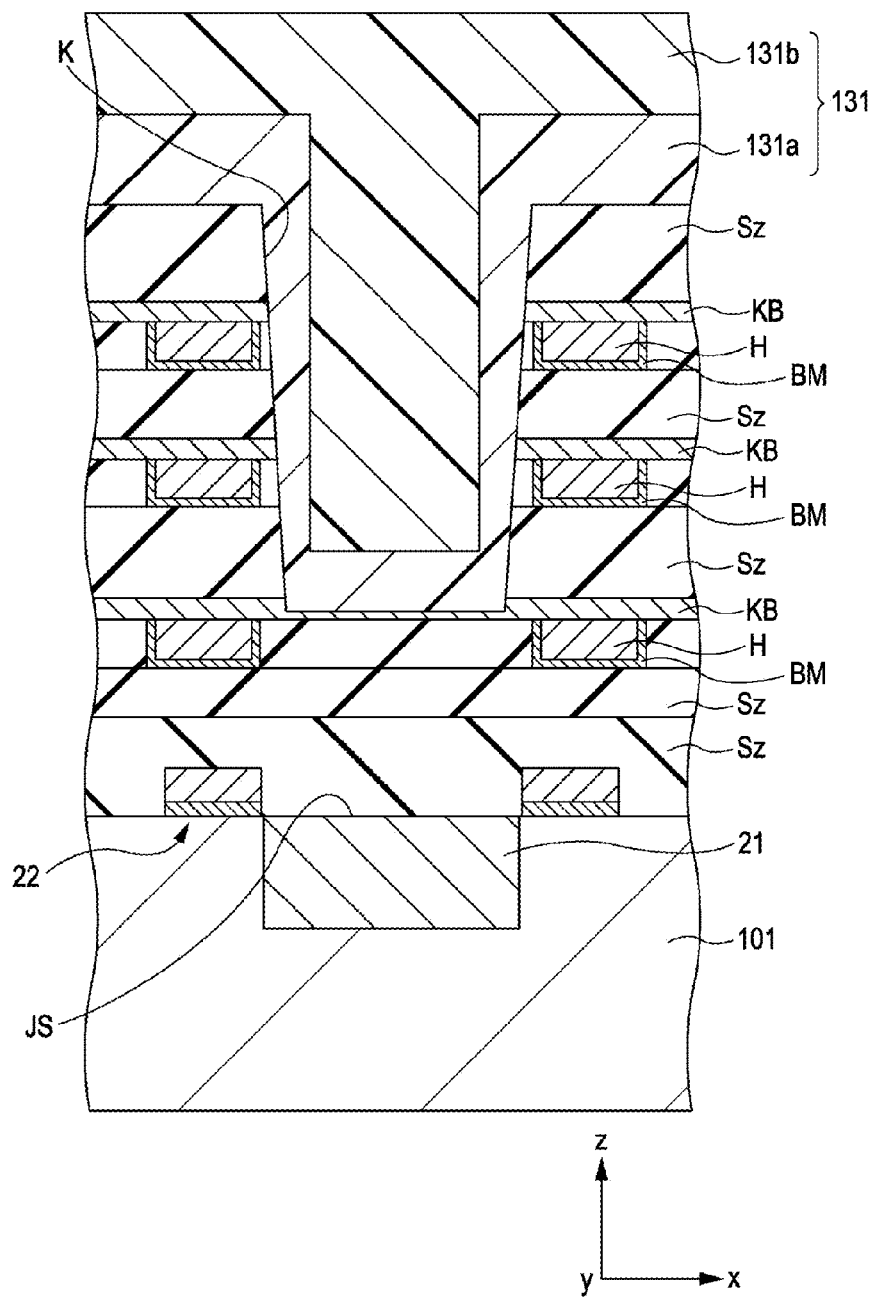
FIG. 8 is a cross-sectional view showing the relevant part formed in a step of the method of producing the solid-state imaging device in the first embodiment of the present invention.

Next, as shown in FIG. 8, a second core portion 131b is formed.

In this embodiment, after the first core portion 131a is deposited on the surface of the hole K as described above, the second core portion 131b is formed by filling the hole K with an optical material. The second core portion 131b is formed by, for example, forming an acrylic resin film by a spin-coating method.

In this embodiment, the second core portion 131b is formed so that the second core portion 131b contains a material that absorbs exposure light radiated onto a photosensitive resin film when an exposure process is performed in the formation of a color filter 301.

For example, the second core portion 131b is formed so as to contain a dye that absorbs the exposure light.

Specifically, as described below, in the exposure process performed in the formation of the color filter 301, the i-line is used as exposure light radiated onto a photosensitive resin film. That is, a mask pattern image is transferred to the photosensitive resin film by irradiating a photomask with the i-line. Therefore, in the formation of the second core portion 131b, a dye that significantly absorbs this i-line is incorporated. For example, the second core portion 131b is formed so as to absorb light having a wavelength of 350 nm or less.

Accordingly, reflection of the exposure light during the exposure process can be prevented, and thus the color filter 301 can be formed by patterning with a high accuracy. In this case, it is desirable that the second core portion 131b contain a dye that significantly absorbs the i-line (wavelength: 370 nm), which is used as the exposure light, rather than light with a center wavelength which is received by the photodiode 21. That is, it is preferable to use a dye having a higher transmittance at the center wavelength of light that is transmitted through the color filter 301 than the transmittance of the i-line.

Figure 10A:
FIGS. 10A to 10C include chemical formulae and graphs each showing an example of a dye incorporated in a second core portion 131b in the first embodiment of the present invention.
Figure 10A:
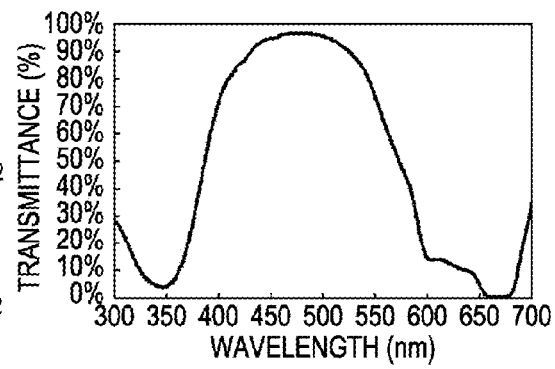
Figure 10B:
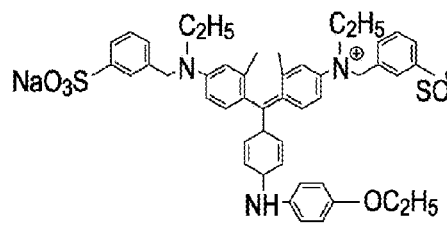
Figure 10B:
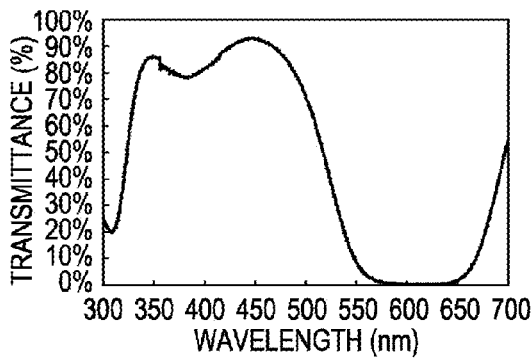
Figure 10C:
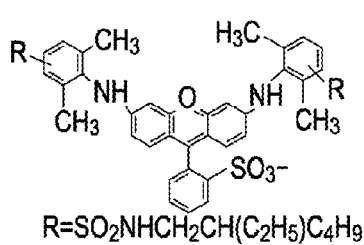
Figure 10C:
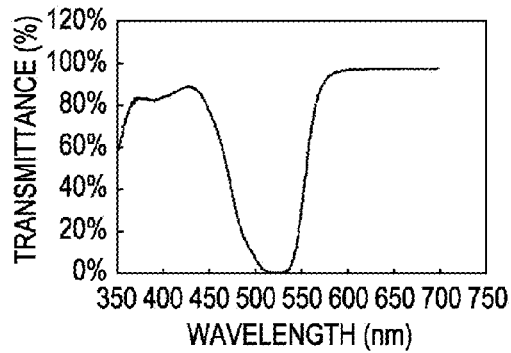

FIGS. 10A to 10C include chemical formulae and graphs each showing an example of a dye incorporated in the second core portion 131b in the first embodiment of the present invention. In each of FIGS. 10A to 10C, the left side shows the chemical formula of the dye, and the right side shows a graph showing the relationship between the wavelength of light and the transmittance thereof.

Specifically, a phthalocyanine dye shown in FIG. 10A, a triarylmethane dye shown in FIG. 10B, or a xanthene dye shown in FIG. 10C can be used. By appropriately adjusting the amount of dye added, the i-line is absorbed and thus the color filter 301 can be patterned with a high accuracy. Furthermore, the absorption of visible light is decreased, whereby the photodiode 21 can efficiently receive the visible light.

As described above, the optical waveguide core portion 131 including the first core portion 131a and the second core portion 131b is formed.

Figure 9:
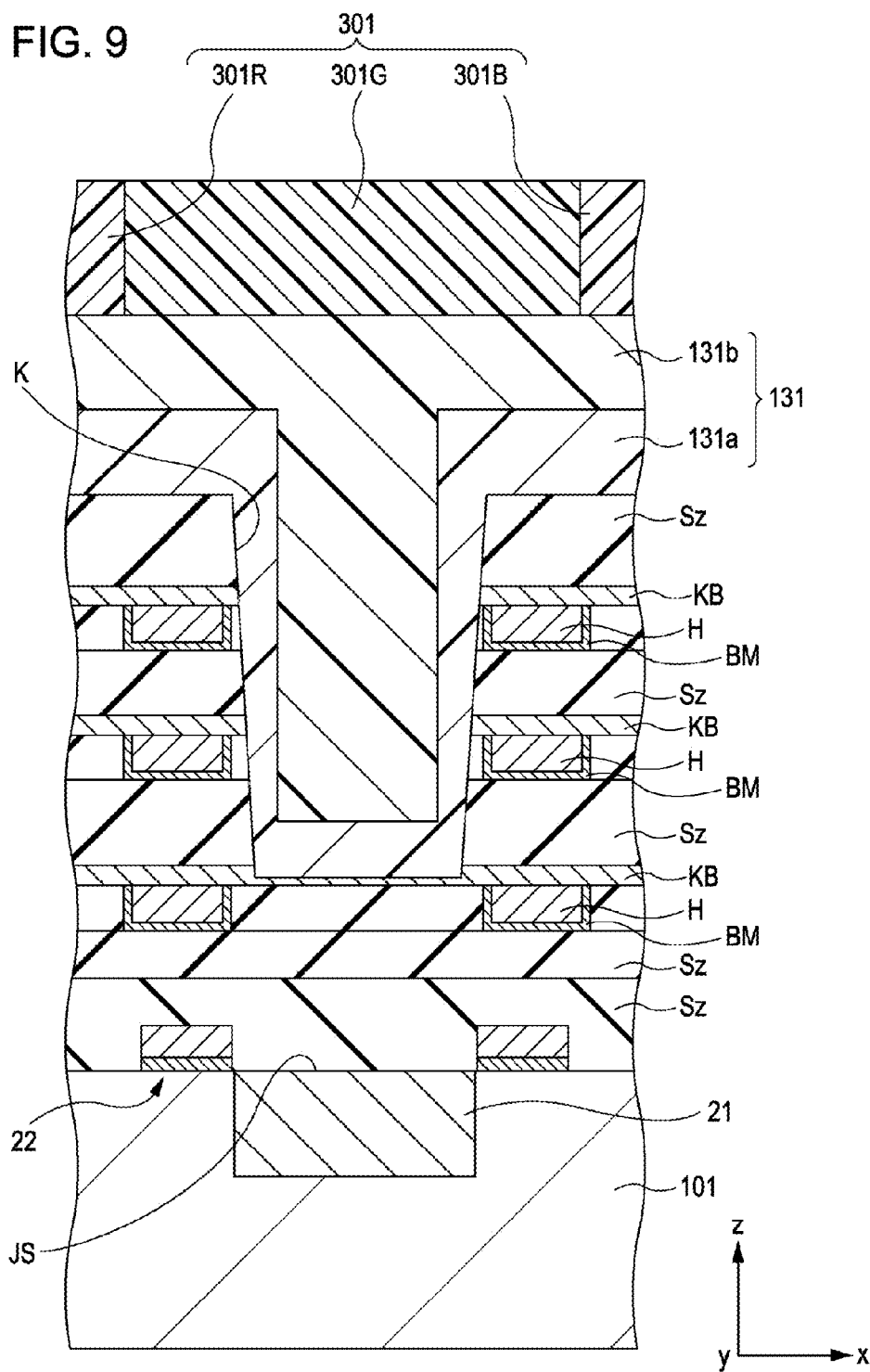
FIG. 9 is a cross-sectional view showing the relevant part formed in a step of the method of producing the solid-state imaging device in the first embodiment of the present invention.

Next, as shown in FIG. 9, the color filter 301 is formed.

In this embodiment, a coating solution containing a dye and a photosensitive resin is applied by a spin-coating method to form a coating film, and the coating film is then patterned by a lithography technique. Thus, filter layers having different colors and constituting the color filter 301 are sequentially formed.

More specifically, an exposure process is performed by irradiating a photomask with the i-line used as exposure light to transfer a mask pattern image to the formed photosensitive resin film. Subsequently, a development process is performed on the exposed photosensitive resin film. These processes are performed for each color. Accordingly, the green filter layer 301G, the red filter layer 301R, and the blue filter layer 301B are sequentially formed to form the color filter 301.

Subsequently, as shown in FIG. 4, an on-chip lens 111 is formed to produce the solid-state imaging device 1.

As described above, according to this embodiment, in the step of forming the optical waveguide core portion 131, the second core portion 131b of the optical waveguide is formed so that the second core portion 131b absorbs exposure light radiated onto a photosensitive resin film when the exposure process is performed in the step of forming the color filter 301. In this embodiment, the second core portion 131b is formed so that the second core portion 131b contains a dye that absorbs the exposure light.

Figure 11A:
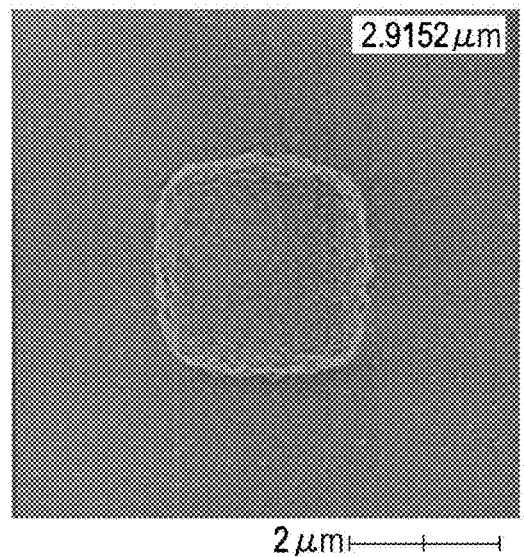
FIGS. 11A and 11B are photographs each showing a part of a color filter formed in the first embodiment of the present invention.
Figure 11B:
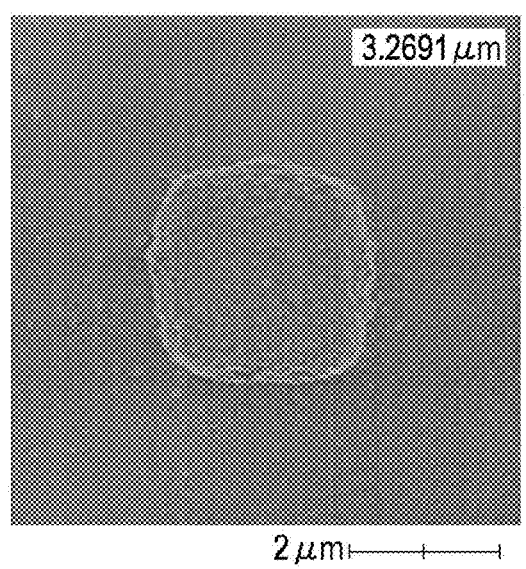

FIGS. 11A and 11B are photographs each showing a part of a color filter 301 formed in the first embodiment of the present invention. FIG. 11A is a SEM image of the color filter 301 prepared in this embodiment. FIG. 11B is a SEM image of a color filter 301 prepared without incorporating a dye that absorbs the exposure light in the second core portion 131b.

As shown in FIGS. 11A and 11B, the color filter 301 shown in FIG. 11A is formed with a high accuracy and the amount of residue of a photosensitive resin film is decreased, as compared with the color filter 301 shown in FIG. 11B.

In the second core portion 131b, the dye absorbs the exposure light, thereby preventing the exposure light from being reflected to the photosensitive resin film by the second core portion 131b.

More specifically, the reflectances of the color filter 301 prepared in this embodiment were as follows:

The reflectance of the green filter layer 301G: 4.8%
The reflectance of the red filter layer 301R: 2.9%
The reflectance of the blue filter layer 301B: 12.6%

In contrast, the reflectances of the color filter 301 prepared without incorporating a dye that absorbs exposure light in the second core portion 131b were as follows:

The reflectance of the green filter layer 301G: 6.6%
The reflectance of the red filter layer 301R: 8.5%
The reflectance of the blue filter layer 301B: 16.2%

Furthermore, the reflectance at the surface of the second core portion 131b was 27%. In contrast, in the case where the second core portion 131b did not contain a dye that absorbs exposure light, the reflectance at the surface of the second core portion 131b was 31%.

Accordingly, in this embodiment, since the reflectance at the second core portion 131b can be decreased as described above, the color filter can be patterned with a high accuracy and the amount of residue of the photosensitive resin film can be decreased. Consequently, the image quality of an acquired image can be improved.

Furthermore, the method according to this embodiment does not include a step of separately forming an underlayer-planarizing film under the photosensitive resin film. Therefore, an increase in the number of production steps can be prevented in this embodiment, thereby preventing the production efficiency from decreasing.

Furthermore, since such an underlayer-planarizing film is not provided, the structure of this embodiment can prevent the occurrence of a problem that the presence of the underlayer-planarizing film decreases the amount of light received by the photodiode 21, resulting in a decrease in the sensitivity.

Figure 12:
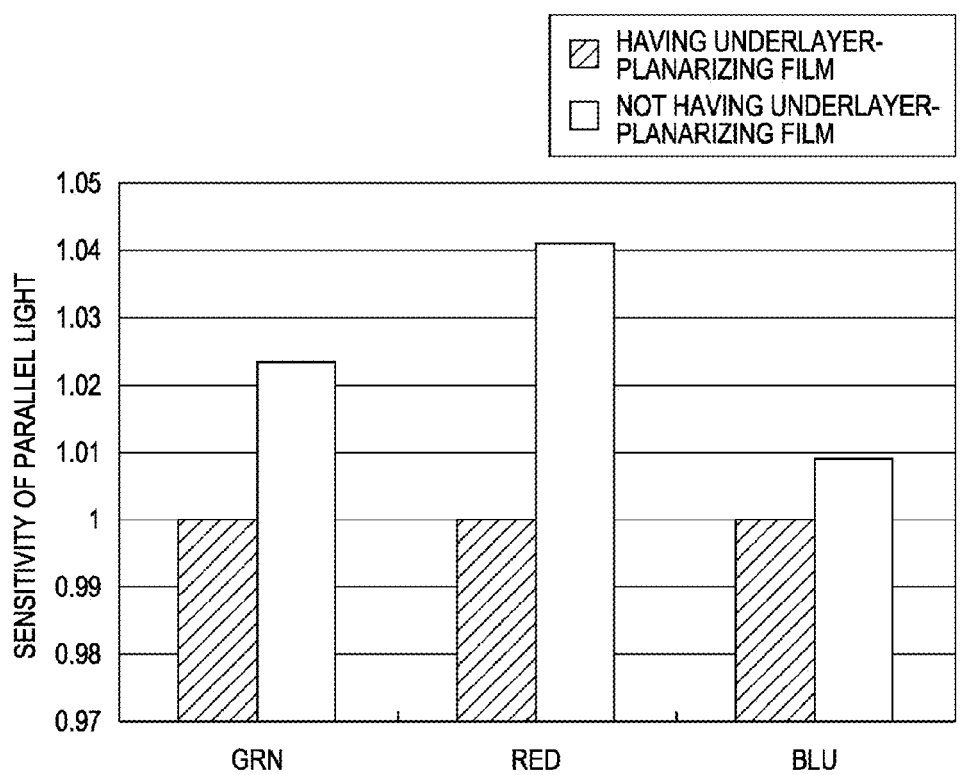
FIG. 12 is a graph showing results of the effect of the presence or absence of an underlayer-planarizing film in the first embodiment of the present invention.

FIG. 12 is a graph showing results of the effect of the presence or absence of an underlayer-planarizing film in the first embodiment of the present invention. FIG. 12 shows the sensitivity of parallel light received by a photodiode, the parallel light being incident through a green filter layer (GRN), a red filter layer (RED), or a blue filter layer (BLU). In the graph, the sensitivity obtained when an underlayer-planarizing film is provided is assumed to be "1", and the sensitivity calculated in this embodiment in which the underlayer-planarizing film is not provided is shown.

As shown in FIG. 12, a higher light-receiving sensitivity can be obtained in this embodiment in which the underlayer-planarizing film is not provided because the effect of interface reflection is decreased. Specifically, the sensitivity to light incident through the green filter layer (GRN) is increased by about 2.3%. The sensitivity to light incident through the red filter layer (RED) is increased by about 4%. The sensitivity to light incident through the blue filter layer (BLU) is increased by about 0.9%.

In the above embodiment, the second core portion 131b is formed so that the second core portion 131b contains a dye that absorbs exposure light radiated onto a photosensitive resin film when an exposure process is performed in the formation of the color filter 301. However, the structure of the solid-state imaging device 1 is not limited thereto. For example, the above dye may be incorporated in both the first core portion 131a and the second core portion 131b. Alternatively, the dye may be incorporated in the first core portion 131a only.

Second Embodiment

Figure 13:
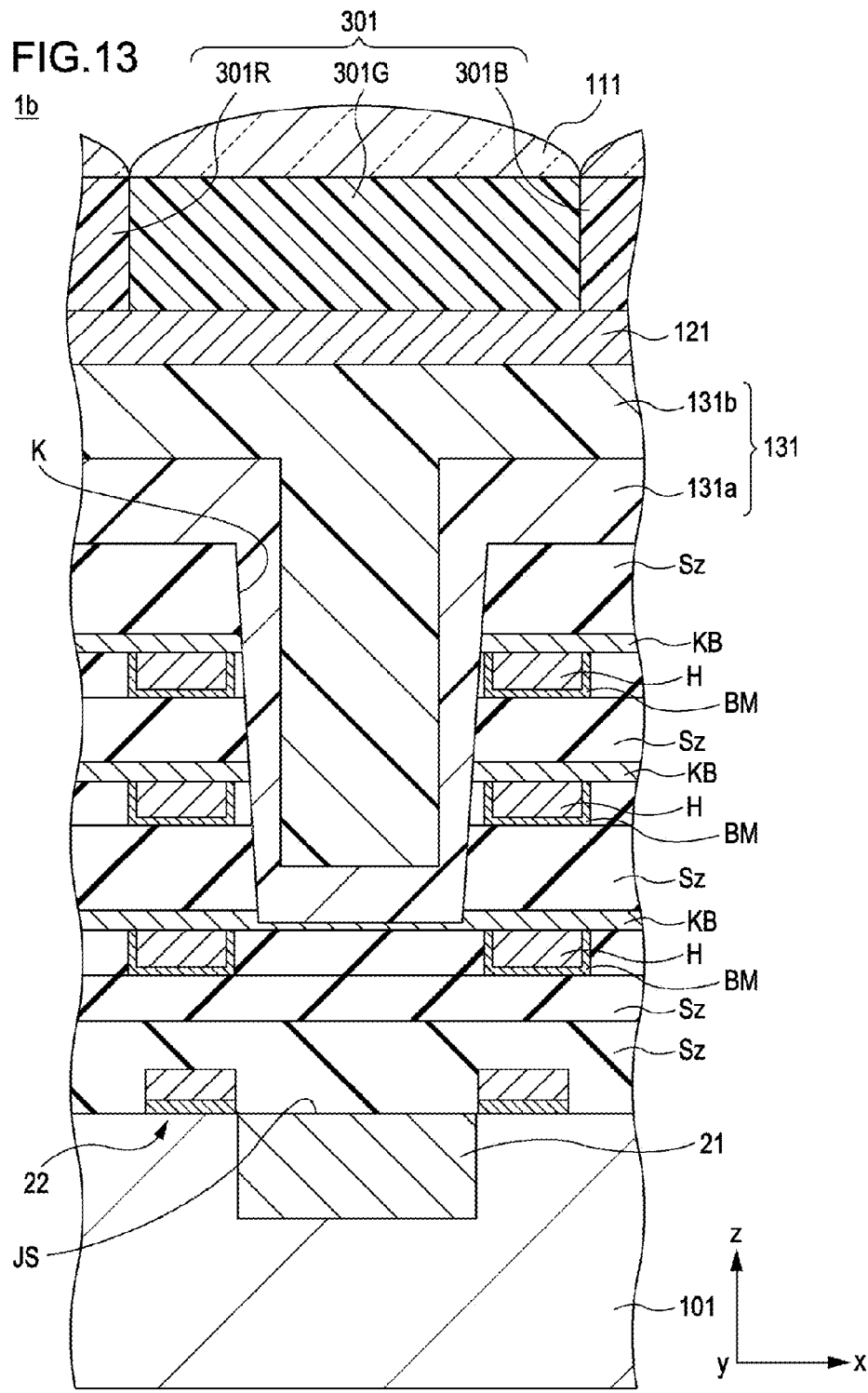
FIG. 13 is a cross-sectional view showing the relevant part of a solid-state imaging device in a second embodiment of the present invention.

FIG. 13 is a cross-sectional view showing the relevant part of a solid-state imaging device 1b in a second embodiment of the present invention. FIG. 13 shows a cross section of a pixel P as in FIG. 4.

As shown in FIG. 13, the solid-state imaging device 1b of the second embodiment differs from the solid-state imaging device 1 of the first embodiment in that the solid-state imaging device 1b further includes an adhesive layer 121 and that the second core portion 131b is composed of a polyimide resin. The second embodiment is the same as the first embodiment except for these points. Accordingly, a description of overlapping parts is omitted.

As shown in FIG. 13, the adhesive layer 121 is provided between the color filter 301 and the second core portion 131b and closely contacts the color filter 301 and the second core portion 131b.

The adhesive layer 121 is formed so as to contain the same resin as the resin used in the formation of the color filter 301. A step of forming the adhesive layer 121 is performed between the step of forming the second core portion 131b and the step of forming the color filter 301. The adhesive layer 121 is formed by, for example, applying a coating solution containing the resin by a spin-coating method, and the drying the coating solution. The adhesive layer 121 is provided on the surface of the second core portion 131b and covers minute surface irregularities that are generated by the presence of the dye etc. contained in the second core portion 131b to planarize the surface of the second core portion 131b.

As described above, when the second core portion 131b is composed of a polyimide resin, which is different from the acrylic resin constituting the color filter 301, the adhesiveness between the second core portion 131b and the color filter 301 may be insufficient. However, in this embodiment, the adhesive layer 121 containing the same resin as the resin used in the formation of the color filter 301 is interposed between the second core portion 131b and the color filter 301. Furthermore, the adhesive layer 121 planarizes the surface of the second core portion 131b. Accordingly, in this embodiment, the color filter 301 and the second core portion 131b can suitably and closely contact with each other.

Note that the adhesive layer 121 can be formed using various resin materials instead of using the above-described material. For example, when the color filter 301 is composed of an acrylic resin and the second core portion 131b is composed of polysiloxane, the adhesive layer 121 is preferably composed of an acrylic resin containing an epoxy group. Specifically, a methacrylate copolymer containing benzyl methacrylate or the like or an addition polymer of a diol and an acid dianhydride is used. An example of the addition polymer of a diol and an acid dianhydride is a polymer, such as an epoxy acrylate, the main chain of which has a half-ester structure obtained by addition-polymerizing a diol component and an acid dianhydride.

Third Embodiment

In a third embodiment, a part of the step of forming the second core portion 131b is different from the step in the first embodiment. The third embodiment is the same as the first embodiment except for this point. Accordingly, a description of overlapping parts is omitted.

In the third embodiment, in the formation of a second core portion 131b, unlike the step in the first embodiment, the second core portion 131b is formed without incorporating a dye that absorbs exposure light radiated onto a photosensitive resin film when an exposure process is performed in the step of forming a color filter 301. In addition, irregularities are formed on a surface of the second core portion 131b so that the exposure light is scattered at the surface.

Specifically, as shown in FIG. 7 in the first embodiment, the first core portion 131a is deposited on the surface of the hole K.

Next, as shown in FIG. 8 in the first embodiment, the second core portion 131b is formed by filling the hole K with an optical material. The second core portion 131b is formed by, for example, forming an acrylic resin film that does not contain a dye by a spin-coating method.

Next, a surface treatment is performed on the surface of the second core portion 131b.

In this embodiment, irregularities are formed on the surface of the second core portion 131b so that exposure light radiated onto a photosensitive resin film when an exposure process is performed in a subsequent step of forming a color filter 301 is scattered at the surface.

Specifically, an ashing treatment is performed as the surface treatment on the surface of the second core portion 131b, thereby forming irregularities on the surface of the second core portion 131b.

For example, this ashing treatment is performed using oxygen plasma. More specifically, the ashing treatment is performed under the following conditions: The type of a gas is $O_2$, the flow rate of the gas is 100 sccm, the pressure is 1.0 Pa, and an RF power is 100 W. Consequently, a surface having a center-line surface roughness (Ra) of 0.317 nm and a root-mean-square (RMS) roughness of 0.424 nm could be formed on the second core portion 131b.

In the second core portion 131b of this embodiment, a phenomenon in which exposure light is reflected to a photosensitive resin film by the second core portion 131b is prevented.

Specifically, the reflectances of the color filter 301 prepared in this embodiment were as follows:

The reflectance of the green filter layer 301G: 4.9%
The reflectance of the red filter layer 301R: 3.0%
The reflectance of the blue filter layer 301B: 11.4%

For comparison, a solid-state imaging device was prepared without performing the ashing treatment on the surface of the second core portion 131b. That is, unlike the third embodiment, irregularities were not formed on the surface of the second core portion 131b of this solid-state imaging device. In this case, the reflectances of the color filter 301 were as follows:

The reflectance of the green filter layer 301G: 6.6%
The reflectance of the red filter layer 301R: 8.5%
The reflectance of the blue filter layer 301B: 16.2%

In the case where the irregularities were formed by the ashing treatment, the reflectance at the surface of the second core portion 131b was low, as compared with the case where the ashing treatment was not performed. Consequently, the reflectances of the color filter 301 were also low.

Accordingly, in this embodiment, the color filter can be patterned with a high accuracy and the amount of residue of the photosensitive resin film can be decreased. Consequently, the image quality of an acquired image can be improved.

In the above surface treatment, the surface of the second core portion 131b is formed so that the center-line surface roughness (Ra) is in the range of, for example, 0.4 to 0.8 nm (0.7 to 1.1 nm in terms of RMS). When the surface roughness is the upper limit or less of the above range, a decrease in the light transmittance of the second core portion 131b can be prevented. Specifically, when Ra exceeds 0.8 nm, the light transmittance of light having a wavelength of 400 nm (60-nm conversion value) is 97%. On the other hand, when Ra is in the range of about 0.3 to 0.5 nm, the light transmittance is 100%, and thus this range is particularly suitable.

As described above, in the third embodiment, irregularities are formed on the surface of the second core portion 131b. The irregularities are formed so that exposure light radiated onto a photosensitive resin film when an exposure process is performed in a step of forming the color filter 301 is scattered at the surface of the second core portion 131b. Accordingly, in this embodiment, the effect of the reflected light, which is generated when the exposure light is reflected at the second core portion 131b, on the photosensitive resin film can be decreased.

Accordingly, in this embodiment, as in the case of the first embodiment, the color filter can be patterned with a high accuracy and the amount of residue of the photosensitive resin film can be decreased. Consequently, the image quality of an acquired image can be improved.

In this embodiment, a surface of the second core portion 131b is modified by performing a surface treatment, but the embodiment is not limited thereto. For example, not only the surface of the second core portion 131b but also the whole second core portion 131b including the inside thereof may be modified.

Alternatively, when irregularities are formed on the surface of the second core portion 131b, an etching process may be performed using a $CF_4$ as a gas instead of performing the ashing process described above.

Alternatively, the surface treatment of the second core portion 131b may be an ion implantation treatment. In such a case, for example, an ion implantation treatment of phosphorus (P) or nitrogen (N) is performed under an acceleration energy in the range of 80 to 140 KeV so that the impurity concentration is in the range of $1 \times 10^{13}/cm^3$ to $1 \times 10^{14}/cm^3$.

Fourth Embodiment

In a fourth embodiment, a part of the step of forming the second core portion 131b is different from the step in the first embodiment. The fourth embodiment is the same as the first embodiment except for this point. Accordingly, a description of overlapping parts is omitted.

In the fourth embodiment, unlike the first embodiment, the second core portion 131b is formed so that the second core portion 131b does not contain a dye that absorbs exposure light radiated onto a photosensitive resin film when an exposure process is performed in the step of forming the color filter 301.

In this embodiment, the second core portion 131b is formed so that the second core portion 131b contains a resin that absorbs exposure light radiated onto a photosensitive resin film when an exposure process is performed in the step of forming the color filter 301.

In this embodiment, the second core portion 131b is formed of a resin including a conjugated double bond.

Specifically, as shown in FIG. 7 in the first embodiment, the first core portion 131a is deposited on the surface of the hole K.

Next, as shown in FIG. 8 in the first embodiment, the second core portion 131b is formed by filling the hole K with an optical material. The second core portion 131b is formed by, for example, forming a film of a resin including a conjugated double bond by a spin-coating method.

Specifically, as the resin including a conjugated double bond, a resin containing a polyene [H—(CH=CH)$_n$—H] or a polyacene can be used. Examples of the resin include acrylic resins, polyimide resins, and polysiloxane resins all of which contain a polyene or a polyacene.

In this embodiment, the second core portion 131b is preferably formed of a resin that significantly absorbs ultraviolet light, such as the i-line (wavelength: 365 nm), which is used as exposure light, rather than visible light with a center wavelength which is received by the photodiode 21.

Accordingly, in this embodiment, the following polyenes are preferably used (refer to http://www.ecosci.jp/color/mol_color1.html).

1,3-Butadiene (absorption wavelength $\lambda_{max}$=217 nm)
1,3,5-Hexatriene (absorption wavelength: $\lambda_{max}$=268 nm)
1,3,5,7-Octatetraene (absorption wavelength: $\lambda_{max}$=304 nm)

1,3,5,7,9-Decapentaene (absorption wavelength: $\lambda_{max}$=334 nm)

1,3,5,7,9,11-Dodecahexaene (absorption wavelength: $\lambda_{max}$=364 nm)

For the same reason, the following polyacenes are preferably used.

Benzene (absorption wavelength: $\lambda_{max}$=203 nm)
Naphthalene (absorption wavelength: $\lambda_{max}$=314 nm)
Anthracene (absorption wavelength: $\lambda_{max}$=370 nm)

As described above, according to this embodiment, the second core portion 131b an optical waveguide is formed so that the second core portion 131b absorbs the exposure light radiated onto the photosensitive resin film when the exposure process is performed in the step of forming the color filter 301. In this embodiment, the second core portion 131b is formed so that the second core portion 131b contains a resin that absorbs the exposure light.

Accordingly, in this embodiment, as in the first embodiment, the color filter can be patterned with a high accuracy and the amount of residue of the photosensitive resin film can be decreased. Consequently, the image quality of an acquired image can be improved.

Note that, in this embodiment, an adhesive layer may further be provided as in the second embodiment.

Furthermore, when the second core portion 131b is formed by using a conjugated double bond-containing resin which absorbs the i-line to a lesser extent than the visible light, for example, a polyene [H—(CH=CH)$_n$—H] or a polyacene below, a surface treatment is preferably performed on the second core portion 131b.

1,3,5,7,9,11,13-Tetradecaheptaene (absorption wavelength $\lambda_{max}$=390 nm)

1,3,5,7,9,11,13,15-Hexadecaoctaene (absorption wavelength $\lambda_{max}$=410 nm)

1,3,5,7,9,11,13,15,17,19-Icosadecaene (absorption wavelength $\lambda_{max}$=422 nm)

Naphthacene (absorption wavelength $\lambda_{max}$=460 nm)

This surface treatment is performed on the second core portion 131b so that the resin constituting the second core portion 131b absorbs exposure light radiated onto a photosensitive resin film when an exposure process is performed in a subsequent step of forming a color filter 301.

In this surface treatment, a conjugated double bond of the resin is cleaved so that the resin including the conjugated double bond absorbs the exposure light.

Specifically, this surface treatment is performed by conducting an ashing treatment on the surface of the second core portion 131b. For example, this ashing treatment is conducted using oxygen plasma.

Alternatively, the surface treatment of the second core portion 131b may be performed by conducting an ion implantation treatment, i.e., by implanting ions into the second core portion 131b.

As described above, the resin may be modified so as to significantly absorb the i-line used as exposure light by cleaving a conjugated double bond included in the resin with the above-described surface treatment.

In this embodiment, a surface of the second core portion 131b is modified by performing a surface treatment, but the embodiment is not limited thereto. For example, not only the surface of the second core portion 131b but also the whole second core portion 131b including the inside thereof may be modified.

In the implementation of the present invention, the present invention is not limited to the embodiments described above, and various modifications may be adopted.

In the above embodiments, a description has been made of cases where the present invention is applied to a CMOS image sensor, but the application of the present invention is not limited thereto. For example, the present invention can be applied to a CCD image sensor.

The solid-state imaging device 1 corresponds to a solid-state imaging device according to an embodiment of the present invention. The photodiode 21 corresponds to a photoelectric conversion portion according to an embodiment of the present invention. The adhesive layer 121 corresponds to an adhesive layer according to an embodiment of the present invention. The optical waveguide core portion 131 corresponds to an optical waveguide core portion according to an embodiment of the present invention. The color filter 301 corresponds to a color filter according to an embodiment of the present invention. The light-receiving surface JS corresponds to a light-receiving surface according to an embodiment of the present invention.

The present application contains subject matter related to that disclosed in Japanese Priority Patent Application JP 2008-308295 filed in the Japan Patent Office on Dec. 3, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of producing a solid-state imaging device comprising the steps of:

forming on a substrate a photoelectric conversion portion that receives light on a light-receiving surface and that photoelectrically converts the light received on the light-receiving surface to generate a signal charge;

forming above the light-receiving surface an optical waveguide that guides light to the light-receiving surface and absorbs exposure light from an exposure process during subsequent formation of a color filter; and forming, above the optical waveguide, the color filter from which colored light of selected wavelengths is emitted to the optical waveguide, wherein, in the step of forming the color filter above the optical waveguide, the color filter is formed from a photosensitive resin film containing a first dye by performing the exposure process on the photosensitive resin film and then performing a development process on the photosensitive resin film, in the step of forming the optical waveguide, a core portion of the optical waveguide is formed so that the core portion contains a second dye that absorbs exposure light radiated onto the photosensitive resin film through the color filter when the exposure process is performed in the step of forming the color filter above the optical waveguide, wherein the absorption of the exposure light reduces reflection of the exposure light to the color filter to increase a pattern accuracy of the color filter, and the exposure process is performed after the optical waveguide is formed such that the exposure process uses the optical waveguide to absorb exposure light radiated from the exposure process, wherein the second dye in the core portion absorbs an amount of the exposure light comprising an i-line wavelength light that is greater than an amount of center wavelength light.

2. The method according to claim 1, wherein, in the step of forming the optical waveguide, the core portion is formed so that the core portion contains a resin that absorbs the exposure light.

3. The method according to claim 2, wherein, in the step of forming the optical waveguide, the resin includes a conjugated double bond.

4. The method according to claim 3, wherein the step of forming the optical waveguide includes a step of performing a surface treatment in which the conjugated double bond of the resin is cleaved so that the resin constituting the core portion absorbs the exposure light on a surface facing the color filter at the core portion.

5. The method according to claim 1, further comprising a step of:
forming an adhesive layer that closely contacts the color filter and the core portion of the optical waveguide, the step of forming the adhesive layer being performed between the step of forming the optical waveguide and the step of forming the color filter.

6. The method according to claim 5, wherein,
in the step of forming the adhesive layer, the adhesive layer is formed so that the adhesive layer contains a resin used in the step of forming the color filter.

7. The method of claim 5, wherein the adhesive layer comprises a resin, and wherein the resin is used in the step of forming the color filter.

8. The method of claim 1, wherein the core portion is configured to absorb exposure light having a wavelength of 350 nm or less.

9. The method of claim 1, wherein the second dye in the core portion is a phthalocyanine dye.

10. The method of claim 1, wherein the second dye in the core portion is a triarylmethane dye.

11. The method of claim 1, wherein the second dye in the core portion is a xanthene dye.

12. A method of producing a solid-state imaging device comprising the steps of:
forming on a substrate a photoelectric conversion portion that receives light on a light-receiving surface and that photoelectrically converts the light received on the light-receiving surface to generate a signal charge;
forming above the light-receiving surface an optical waveguide that guides light to the light-receiving surface; and
forming, above the optical waveguide, a color filter from which colored light of selected wavelengths is emitted to the optical waveguide,
wherein,
in the step of forming the color filter, the color filter is formed from a photosensitive resin film containing a dye by performing an exposure process on the photosensitive resin film and then performing a development process on the photosensitive resin film, and
in the step of forming the optical waveguide, a surface treatment for forming irregularities on a surface of a core portion of the optical waveguide is performed so that the irregularities on the surface of the core portion are effective to scatter exposure light radiated onto the photosensitive resin film when the exposure process is performed in the step of forming the color filter, the surface facing the color filter at the core portion,
wherein the irregularities on the surface of the core portion of the optical waveguide are formed by a second dye that is within the core portion.

13. The method of claim 12, wherein:
in the surface treatment, the surface of the core portion is formed so that a center-line surface roughness (Ra) is in a range of 0.4 to 0.8 nm.

14. A solid-state imaging device comprising:
a photoelectric conversion portion that receives light on a light-receiving surface and that photoelectrically converts the light received on the light-receiving surface to generate a signal charge;
an optical waveguide that guides light to the light-receiving surface and absorbs exposure light from an exposure process during subsequent formation of a color filter; and
the color filter, from which colored light of selected wavelengths is emitted to the optical waveguide,
wherein,
the color filter is formed above the optical waveguide by performing the exposure process on a photosensitive resin film containing a first dye and then performing a development process on the photosensitive resin film,
the optical waveguide includes a core portion composed of a material that includes a second dye that absorbs exposure light radiated onto the photosensitive resin film through the color filter when the exposure process is performed in the formation of the color filter above the optical waveguide, wherein the absorption of the exposure light reduces reflection of the exposure light to the color filter to increase a pattern accuracy of the color filter, and
the exposure process is performed after the optical waveguide is formed such that the exposure process uses the optical waveguide to absorb exposure light radiated from the exposure process,
wherein the second dye in the core portion absorbs an amount of the exposure light comprising an i-line wavelength light that is greater than an amount of center wavelength light.

15. A solid-state imaging device comprising:
a photoelectric conversion portion that receives light on a light-receiving surface and that photoelectrically converts the light received on the light-receiving surface to generate a signal charge;
an optical waveguide that guides light to the light-receiving surface and absorbs exposure light from an exposure process during subsequent formation of a color filter; and
the color filter from which colored light of selected wavelengths is emitted to the optical waveguide,
wherein,
the color filter is formed above the optical waveguide by performing the exposure process on a photosensitive resin film containing a first dye and then performing a development process on the photosensitive resin film,
irregularities are provided on a surface of a core portion of the optical waveguide so that the irregularities on the surface of the core portion are effective to scatter exposure light radiated onto the photosensitive resin film through the color filter when the exposure process is performed in the formation of the color filter is scattered at a surface facing the color filter at the core portion above the optical waveguide, wherein the absorption of the exposure light reduces reflection of the exposure light to the color filter to increase a pattern accuracy of the color filter, and the exposure process is performed after the optical waveguide is formed such that the exposure process uses the optical waveguide to absorb exposure light radiated from the exposure process, wherein the irregularities on the surface of the core portion of the optical waveguide are formed by a second dye that is within the core portion.

16. A camera comprising:

a photoelectric conversion portion that receives light on a light-receiving surface and that photoelectrically converts the light received on the light-receiving surface to generate a signal charge;

an optical waveguide that guides light to the light-receiving surface and absorbs exposure light from an exposure process during subsequent formation of a color filter;

and the color filter from which colored light of selected wavelengths is emitted to the optical waveguide, wherein the color filter is formed above the optical waveguide by performing the exposure process on a photosensitive resin film containing a first dye and then performing a development process on the photosensitive resin film, the optical waveguide includes a core portion composed of a material that includes a second dye that absorbs exposure light radiated onto the photosensitive resin film through the color filter when the exposure process is performed in the formation of the color filter above the optical waveguide, wherein the absorption of the exposure light reduces reflection of the exposure light to the color filter to increase a pattern accuracy of the color filter, and the exposure process is performed after the optical waveguide is formed such that the exposure process uses the optical waveguide to absorb exposure light radiated from the exposure process, wherein the second dye in the core portion absorbs an amount of the exposure light comprising an i-line wavelength light that is greater than an amount of center wavelength light.

17. A camera comprising:

a photoelectric conversion portion that receives light on a light-receiving surface and that photoelectrically converts the light received on the light-receiving surface to generate a signal charge;

an optical waveguide that guides light to the light-receiving surface and absorbs exposure light from an exposure process during subsequent formation of a color filter; and the color filter from which colored light of selected wavelengths is emitted to the optical waveguide, wherein the color filter is formed above the optical waveguide by performing the exposure process on a photosensitive resin film containing a first dye and then performing a development process on the photosensitive resin film, irregularities are provided on a surface of a core portion of the optical waveguide so that the irregularities on the surface of the core portion are effective to scatter exposure light radiated onto the photosensitive resin film through the color filter when the exposure process is performed in the formation of the color filter, the surface facing the color filter at the core portion above the optical waveguide, wherein the absorption of the exposure light reduces reflection of the exposure light to the color filter to increase a pattern accuracy of the color filter, and the exposure process is performed after the optical waveguide is formed such that the exposure process uses the optical waveguide to absorb exposure light radiated from the exposure process, wherein the irregularities on the surface of the core portion of the optical waveguide are formed by a second dye that is within the core portion.

\* \* \* \* \*